United States Patent
Nagatani et al.

(10) Patent No.: US 8,187,722 B2
(45) Date of Patent: May 29, 2012

(54) COPPER FOIL WITH CARRIER SHEET, METHOD FOR MANUFACTURING COPPER FOIL WITH CARRIER SHEET, AND SURFACE-TREATED COPPER FOIL WITH CARRIER SHEET

(75) Inventors: Seiji Nagatani, Ageo (JP); Hiroshi Watanabe, Kitamoto (JP); Kazufumi Izumida, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 718 days.

(21) Appl. No.: 12/301,338

(22) PCT Filed: May 18, 2007

(86) PCT No.: PCT/JP2007/060191
§ 371 (c)(1),
(2), (4) Date: Dec. 17, 2008

(87) PCT Pub. No.: WO2007/135972
PCT Pub. Date: Nov. 29, 2007

(65) Prior Publication Data
US 2009/0291319 A1    Nov. 26, 2009

(30) Foreign Application Priority Data

May 19, 2006    (JP) ................................. 2006-140669
Mar. 15, 2007    (JP) ................................. 2007-067657

(51) Int. Cl.
*B32B 15/04*    (2006.01)
*B32B 15/20*    (2006.01)
*C23C 14/00*    (2006.01)
*C23C 14/06*    (2006.01)
*C23C 16/26*    (2006.01)
*C23C 28/00*    (2006.01)

(52) U.S. Cl. ........ 428/607; 428/634; 428/660; 428/674; 428/215; 428/216; 428/336; 427/249.1; 427/249.6; 427/249.7; 427/249.8; 427/250; 204/192.1; 204/192.15; 205/186

(58) Field of Classification Search ................ 428/577, 428/606, 607, 609, 634, 655, 656, 660, 661, 428/662, 663, 664, 665, 666, 668, 669, 674, 428/675, 676, 212, 213, 215, 216, 220, 332, 428/335, 336, 337, 446, 448, 450, 408
See application file for complete search history.

(56) References Cited

U.S. PATENT DOCUMENTS 3,998,601 A * 12/1976 Yates et al. ................ 428/607
(Continued)

FOREIGN PATENT DOCUMENTS

EP    1 133 220    9/2001
(Continued)

OTHER PUBLICATIONS

English Language Abstract of JP 10-18075, Jan. 1998.
(Continued)

*Primary Examiner* — Michael LaVilla
(74) *Attorney, Agent, or Firm* — Greenblum & Bernstein, P.L.C.

(57) ABSTRACT

An object of the present invention is to provide a copper foil with carrier sheet which permits releasing of the carrier sheet from the copper foil layer even when hot pressing at a temperature exceeding 300° C. is applied in the production of a printed wiring board. In order to achieve the object, a copper foil with physically releasable carrier sheet having a copper foil layer on the surface of the carrier sheet through a bonding interface layer, characterized in that the bonding interface layer is composed of a metal layer and a carbon layer. It is preferable for the bonding interface layer to be composed of a metal layer of 1 nm to 50 nm thick and a carbon layer of 1 nm to 20 nm thick.

18 Claims, 3 Drawing Sheets

U.S. PATENT DOCUMENTS

| | | | |
|---|---|---|---|
| 6,779,262 B1 * | 8/2004 | Gales et al. | 29/852 |
| 2003/0153169 A1 * | 8/2003 | Wang et al. | 438/586 |

FOREIGN PATENT DOCUMENTS

| | | |
|---|---|---|
| JP | 8-158027 | 6/1996 |
| JP | 10-18075 | 1/1998 |
| JP | 2000-309898 | 11/2000 |
| JP | 2001-68804 | 3/2001 |
| JP | 2003-181970 | 7/2003 |
| JP | 2005-502496 | 1/2005 |
| JP | 2005-260058 | 9/2005 |
| JP | 2007-81274 | 3/2007 |
| WO | 2002/024444 | 3/2002 |

OTHER PUBLICATIONS

English Language Abstract of JP 8-158027, Jun. 1996.
English Language Abstract of JP 2005-502496, Jan. 2005.
English Language Abstract of WO 2002/024444, Mar. 2002.
English Language Abstract of JP 2000-309898, Nov. 2000.
English Language Abstract of JP 2001-68804, Mar. 2001.
English Language Abstract of JP 2003-181970, Jul. 2003.
English Language Abstract of JP 2005-260058, Sep. 2005.
English Language Abstract of JP 2007-81274, Mar. 2007.

* cited by examiner

COPPER FOIL WITH CARRIER SHEET, METHOD FOR MANUFACTURING COPPER FOIL WITH CARRIER SHEET, AND SURFACE-TREATED COPPER FOIL WITH CARRIER SHEET

TECHNICAL FIELD

The present invention relates to a copper foil with carrier sheet, a method for manufacturing the copper foil with carrier sheet, a surface-treated copper foil with carrier sheet manufactured by surface-treating the copper foil with carrier sheet, and a copper-clad laminate using the surface-treated copper foil with carrier sheet. All these are suitable materials for manufacturing printed wiring boards.

BACKGROUND ART

Electrodeposited copper foils such as those disclosed in many literatures including Patent Document 1 and rolled copper foils such as the one disclosed in Patent Document 2 have been conventionally used for the manufacturing of copper-clad laminates. Then, the printed wiring boards have been manufactured by etching the copper layer constituting the copper-clad laminates.

The manufacturing methods of copper-clad laminates are different with their type, rigid type copper-clad laminates or flexible type copper-clad laminates. In manufacturing of the rigid type copper-clad laminates, the popular method is to sandwich a book in which copper foils, resin-impregnated base materials (prepregs) semi-cured to be B stage and mirror plates for spacers are stacked in multiple layers between hot plates, then the resin of the resin-impregnated base materials are cured under a high temperature and high pressure to bond them with the copper foils (hereinafter this process may be sometimes referred to as hot pressing). In manufacturing of the flexible type copper-clad laminates, the popular method is bonding a copper foil to an organic polymer material for the insulating layer, such as polyimide, by hot pressing or roll lamination, or forming a polyimide resin layer by coating a copper foil with a polyamic resin component by casting followed by heating.

On the other hand, printed wiring boards installed in latest downsized electronic equipment are required to have fine-pitch wirings with a view to increasing the packaging density of devices to arrange in the narrower space of the equipments. To qualify the requirement, the industry concerned has been tried to use thinner copper foils. However, the thinner copper foil is more difficult in handling to result defects such as wrinkling. When a copper foil has wrinkles, crack may be generated in wrinkle of copper foil in pressing process and the fluidized resin constituting the prepreg is made to ooze out and contaminate and/or worsen the flatness of the surface of the copper-clad laminate. Such defects of the copper-clad laminate surface may result short-circuit and/or open-circuit in the manufactured printed wiring board. Even when a method such as roll lamination or casting of not hot pressing is used in manufacturing flexible copper-clad laminates, wrinkles in the copper foils would remain as unevenness on the surface of the copper-clad laminates and it may cause similar kind of problems, short-circuit and/or open-circuit.

These problems have been driving force to use electrodeposited copper foils with carrier foil. Electrodeposited copper foil with carrier foil can be classified into the peelable type and the etchable type. Simply speaking, the difference is that the carrier foil on a copper-clad laminate of the peelable type is physically peeled off, but the carrier foil on the copper-clad laminate of the etchable type is etched off. In recent years, demands for peelable type electrodeposited copper foils with carrier foil which has advantage in manufacturing cost because etching process is not required have become significant. Patent Document 3, Patent Document 4 and others disclose peelable type electrodeposited copper foils with carrier foil.

The peelable type electrodeposited copper foil with carrier foil comprises a stacked structure composed of a release layer between a carrier foil layer and a copper foil layer. It is required to have a peelable characteristic for the carrier foil with release strength of 20 gf/cm to 100 gf/cm even after the thermal treatment in the hot pressing. The release strength tends to increase with the rise in hot pressing temperature. However, hot pressing with a liquid crystal polymer base material or a fluorine-containing resin base material are performed at a temperature of exceeding 300° C., and the formation of a polyimide resin layer by casting method adopts a temperature of exceeding 300° C. also. In such a case, when the release layer between the carrier foil layer and the copper foil layer has not enough thermal resistance, counter diffusion may occur between the carrier foil layer and the copper foil layer or among the three layers, carrier foil layer/release layer/copper foil layer, to result phenomenon that the carrier foil is partially torn off to remain on the surface of the copper foil layer or that the carrier foil layer cannot be released from the copper foil layer.

As a method relates to a copper foil with carrier foil which permits easy releasing of the carrier foil even after hot pressing at high temperature, Patent Document 3 discloses a method using just a metal oxide for a bonding interface layer between the carrier layer and the copper foil layer, which makes use the characteristic that the compound is stable at high temperature and generally hard but brittle.

Patent Document 4 discloses an ultra-thin copper foil with carrier formed by stacking a release layer, an anti-diffusion layer and an electrodeposited copper layer on a carrier foil in this order, and the surface of the electrodeposited copper layer is roughening treated. The release layer is an inorganic release layer, preferably a chromium layer or a chrome hydrated oxide layer. The anti-diffusion layer which prevents the diffusion of the release layer when the ultra-thin copper foil with carrier foil is laminated by hot pressing is formed on the release layer. The anti-diffusion layer may be composed of at least one selected from a group of elements comprising nickel, cobalt, iron, chromium, molybdenum, tungsten, copper, aluminum and phosphorus, and of a single metal or a layer of an alloy of two or more metals or of a metal oxide of one kind or more. This is intended to perform both the stability of release strength of the carrier foil after hot pressing and the laser drill ability.

Patent Document 5 discloses an ultra-thin copper foil with carrier foil stacking a carrier foil, a bonding interface layer formed of an organic agent and a copper foil layer in the order. As the bonding interface disclosed in Patent Document 5 is formed by an organic agent, stable or more stable release strength of the carrier foil can be performed than the electrodeposited copper foil with carrier foil disclosed in Patent Document 3 when hot pressed at or below 200° C. However, after hot pressing at a temperature exceeding 200° C., the carrier foil layer cannot be released from the copper foil layer.

By the way, when thiocyanuric acid is used for formation of the bonding interface layer as disclosed in Patent Document 6, it enables releasing of the carrier foil even when a hot pressing temperature is exceeding 300° C. As disclosed in Patent Document 7, as for an electrodeposited copper foil with carrier foil in which a bonding interface layer is formed on one surface of the carrier foil and a copper foil layer is formed on the bonding interface layer, and the bonding interface layer is formed of a metal oxide layer and an organic agent, carrier releasing is easy even after hot pressing at a temperature exceeding 200° C. The metal oxide layer constituting the bonding interface layer may be the oxide of nickel, chromium, titanium, magnesium, iron, cobalt or tungsten or an oxide of alloy containing these elements in a thickness by calculation of 1 nm or more.

As described above, methods for manufacturing a peelable type electrodeposited copper foil with carrier foil, which make releasing of the carrier foil easy even after a hot pressing at high temperature, have been proposed and are effective to some extent.

[Patent Document 1] Japanese Patent Application Laid-Open No. 10-18075
[Patent Document 2] Japanese Patent Application Laid-Open No. 8-158027
[Patent Document 3] Japanese Patent Application Laid-Open No. 2005-502496 (EP 1133220)
[Patent Document 4] WO 2002/024444
[Patent Document 5] Japanese Patent Application Laid-Open No. 2000-309898
[Patent Document 6] Japanese Patent Application Laid-Open No. 2001-68804
[Patent Document 7] Japanese Patent Application Laid-Open No. 2003-181970

DISCLOSURE OF THE INVENTION

When a metal oxide layer is used for the release layer of an electrodeposited copper foil with carrier foil alone as disclosed in Patent Document 3, the bonding state may be stable. However, when it is heated at a high temperature exceeding 300° C., an oxidation-reduction reaction may occur between metal oxide and metal copper to form a metallic bond to result increased release strength between the carrier layer and the copper foil layer. Moreover, the release strength tends to lack stability to make quality assurance of the release strength between the carrier layer and the copper foil layer difficult.

Patent Document 4 discloses that the releasing strength of the carrier foil is greatly affected by the amount of the deposited chromium. However, as is well known to the persons skilled in the art, it is difficult to control the amount of chromium deposition in mass production, and it may result increasing of a management cost in the manufacturing process. Moreover, positive use of chromium is not preferable because chromium is a material to be controlled under the EU directive concerning environmental pollutants (WEEE/RoHS) and the like.

The methods disclosed in Patent Document 6 and Patent Document 7 by which an organic agent is used for the release layer (bonding interface layer) of an electrodeposited copper foil with carrier foil never win the trust in the market for the stability of the release strength of the carrier foil after pressing at a high temperature exceeding 300° C.

As described above, no conventional electrodeposited copper foils with carrier foil could be used in the industrial production with confidence for the manufacture of copper-clad laminates which apply a hot pressing temperature of exceeding 300° C. Therefore, in order to perform the formation of fine pitch circuits on copper-clad laminates which requires a hot pressing temperature of exceeding 300° C., the electrodeposited copper foils with carrier foil which can perform stable release strength between carrier foil layers and copper foil layers available for industrial application even after hot pressing at a temperature exceeding 300° C. have been required.

In view of such problems, after concentrative research, the inventors of the present invention proved that when sputtering vapor deposition is applied for the formation of the bonding interface layer of a peelable type copper foil with carrier sheet, it enables maintaining of the sound bonding interface layer even after loading a high temperature exceeding 300° C., and result low and stable release strength between the carrier sheet layer and the copper foil layer to ease releasing of the carrier sheet. The present invention will be described below.

Copper foil with carrier sheet according to the present invention: A copper foil with carrier sheet of the present invention is the copper foil with physically releasable carrier sheet comprising a copper foil layer on the surface of a carrier sheet through a bonding interface layer which is characterized in that the bonding interface layer has two layer structure composed of a metal layer and a carbon layer formed by using physical vapor deposition.

It is preferable for the thickness by calculation of the carbon layer constituting the bonding interface layer of the copper foil with carrier sheet according to the present invention to be 1 nm to 20 nm.

It is preferable for the metal layer constituting the bonding interface layer to be a layer composed of any of tantalum, niobium, zirconium, nickel, chromium, titanium, iron, silicon, molybdenum, vanadium and tungsten.

It is preferable for the thickness by calculation of the metal layer to the invention to be 1 nm to 50 nm. It is preferable for the thickness by calculation of the bonding interface layer to be 2 nm to 70 nm.

It is preferable for the copper layer of the copper foil with carrier sheet according to the present invention to be formed by electrolysis.

It is preferable for the copper foil layer of the copper foil with carrier sheet according to the present invention to be a copper layer formed by physical vapor deposition.

It is preferable for the copper foil layer to be obtained by forming a first copper layer of 10 nm to 300 nm thick by physical vapor deposition and forming a second copper layer by electrolysis.

It is preferable for the release strength of the carrier sheet as received of the copper foil with carrier sheet according to the present invention to be 2 gf/cm to 20 gf/cm.

It is preferable for the release strength of the carrier sheet after heating 30 minutes at 300° C. to 350° C. of the copper foil with carrier sheet according to the present invention to be 5 gf/cm to 50 gf/cm.

It is preferable to use a metal foil of 12 μm to 210 μm thick for the carrier sheet of the copper foil with carrier sheet according to the present invention.

A surface-treated copper foil with carrier sheet according to the present invention: A surface-treated copper foil with carrier sheet according to the present invention is the surface-treated copper foil with carrier sheet obtained by subjecting one, two or more selected from roughening treatment, rust-proofing treatment and silane coupling agent treatment to the surface of the copper foil layer of the copper foil with carrier sheet described above.

Manufacturing method of a copper foil with carrier sheet according to the present invention: For the manufacturing method of the copper foil with carrier sheet according to the present invention, it is preferable to apply a first manufacturing method or a second manufacturing method selected from the following manufacturing methods.

The first manufacturing method is characterized in comprising process A and process B.

Process A: a bonding interface layer forming process to form a bonding interface layer in which a metal layer and a carbon layer are stacked on the surface of the carrier sheet by using thin film forming technologies; and Process B: a copper foil layer forming process to form a copper foil layer by electrolysis or physical vapor deposition on said bonding interface layer composed of the metal layer and the carbon layer.

A second manufacturing method is characterized in comprising processes a to c.

Process a: a bonding interface layer forming process to form a bonding interface layer in which a metal layer and a carbon layer are stacked on the surface of the carrier sheet by using thin film forming technologies;

Process b: a first copper layer forming process to form a first copper layer on the surface of said carbon layer by using physical vapor deposition; and Process c: a copper foil layer forming process to form a second copper foil layer by electrolysis on said first copper layer to finish the copper foil layer.

In the first manufacturing method and the second manufacturing method of the copper foil with carrier sheet according to the present invention, for the thin film forming technologies in process A or process a, it is preferred to choose sputtering vapor deposition from various physical vapor deposition methods.

The sputtering vapor deposition in process A and/or process a comprises step i and step ii described below.

Step i: a step to form the metal layer by depositing metal atoms on the surface of the carrier sheet by sputtering vapor deposition using one target material selected from tantalum, niobium, zirconium, nickel, chromium, titanium, iron, silicon, molybdenum, vanadium and tungsten; and Step ii: a step to finish a bonding interface layer by forming a carbon layer on said metal layer by sputtering vapor deposition using a carbon target material.

A copper-clad laminate according to the present invention: A copper-clad laminate of high quality can be provided by using the surface-treated copper foil with carrier sheet according to the present invention.

The copper foil with carrier sheet according to the present invention which has a stacked structure of carrier sheet layer/bonding interface layer/copper foil layer is characterized in that a bonding interface layer is formed by a thin film forming technologies, typically sputtering vapor deposition. As the bonding interface layer is composed of a metal layer and a carbon layer, the bonding interface layer (releasing layer) shows superior stability in thermal resistance than the conventional peelable type copper foils with carrier sheet. As a result, releasing of the carrier sheet is dramatically made ease even after hot pressing at a temperature exceeding 300° C.

Also, the copper foil with carrier sheet according to the present invention can be made to be a surface-treated copper foil with carrier sheet by providing, a rust-proofing layer to assure long shelf life, roughening treatment and/or silane coupling agent treatment and the like to enhance adhesion to the base resin, on the copper foil surface. Main products supplied to the market might be a surface-treated copper foil with carrier sheets.

Furthermore, the method for manufacturing the copper foil with carrier sheet according to the present invention discloses conditions which enable formation of the metal layer and the carbon layer in uniform thickness on the surface of the carrier sheet efficiently. In particular, it can be applied to continuous formation of metal layers and carbon layers sequentially on the surface of the carrier sheet unwound from a carrier sheet roll having a width of over 1 m.

DESCRIPTION OF SYMBOLS

Figure 1:
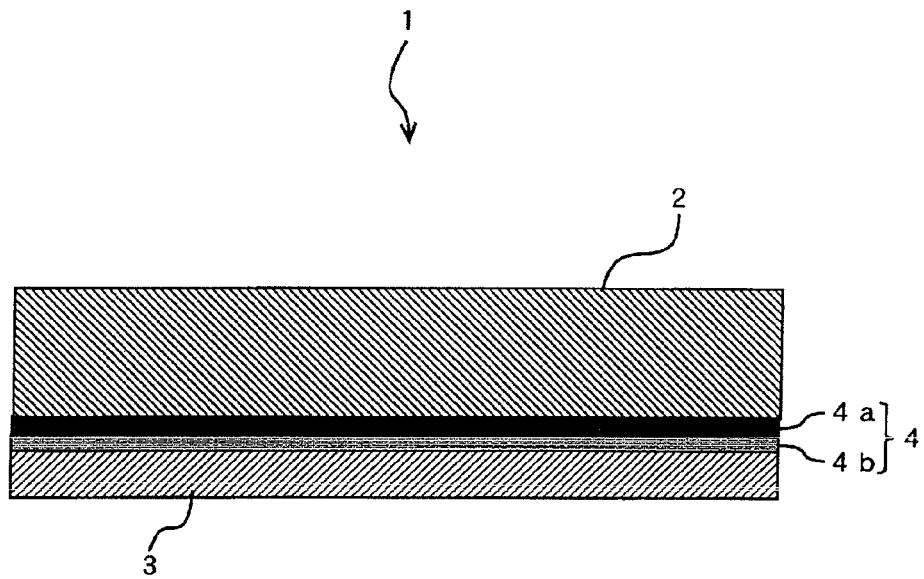
FIG. 1 is a schematic sectional view of a first copper foil with carrier sheet.

1 First copper foil with carrier sheet
1' First double-side copper foil with carrier sheet
2 Carrier sheet
3 Copper foil layer
4 Bonding interface layer
4a Metal layer
4b Carbon layer
5 Fine copper particles
6 Rust-proofing layer
7 Silane coupling agent treating layer
10 Surface-treated copper foil with carrier sheet
20 Second copper foil with carrier sheet
20' Second double-side copper foil with carrier sheet
21 First copper layer
22 Second copper layer

BEST MODES FOR CARRYING OUT THE INVENTION

The copper foil with carrier sheet, the surface-treated copper foil with carrier sheet, the method for manufacturing the copper foil with carrier sheet, and the copper-clad laminate using the surface-treated copper foil with carrier sheet according to the present invention will be described in detail below.

Figure 2:
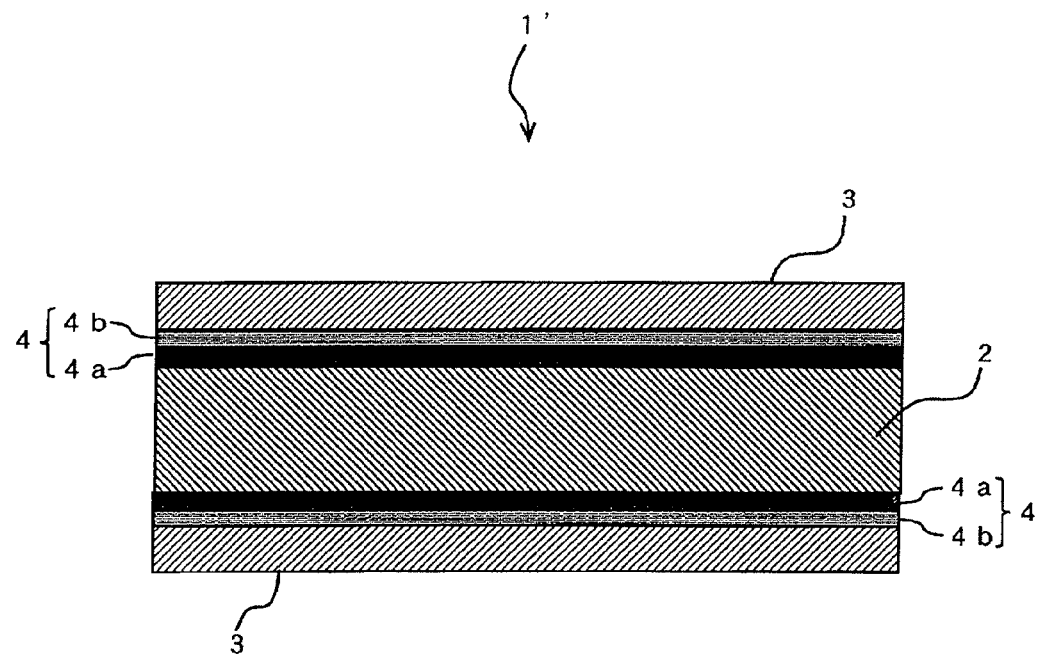
FIG. 2 is a schematic sectional view of a first double-side copper foil with carrier sheet.

Embodiment of the copper foil with carrier sheet according to the present invention: The basic stacked structure of the copper foil with carrier sheet (a first copper foil with carrier sheet) according to the present invention is shown in FIG. 1. As is seen in the FIG. 1, a copper foil with carrier sheet 1 according to the present invention, a bonding interface layer 4 is provided between a carrier sheet 2 and a copper foil layer 3. And the bonding interface layer is composed of a metal layer 4a and a carbon layer 4b to enable the carrier sheet to be physically peeled off. The bonding interface layer may either be formed on one surface or both surfaces of the carrier sheet. The copper foil layer in the following description is deposited on the bonding interface layer formed before. Therefore, the copper foil with carrier sheet according to the present invention may have copper foil layers on both surfaces of the carrier sheet as shown in FIG. 2 as well as the first copper foil with carrier sheet 1'.

Figure 3:
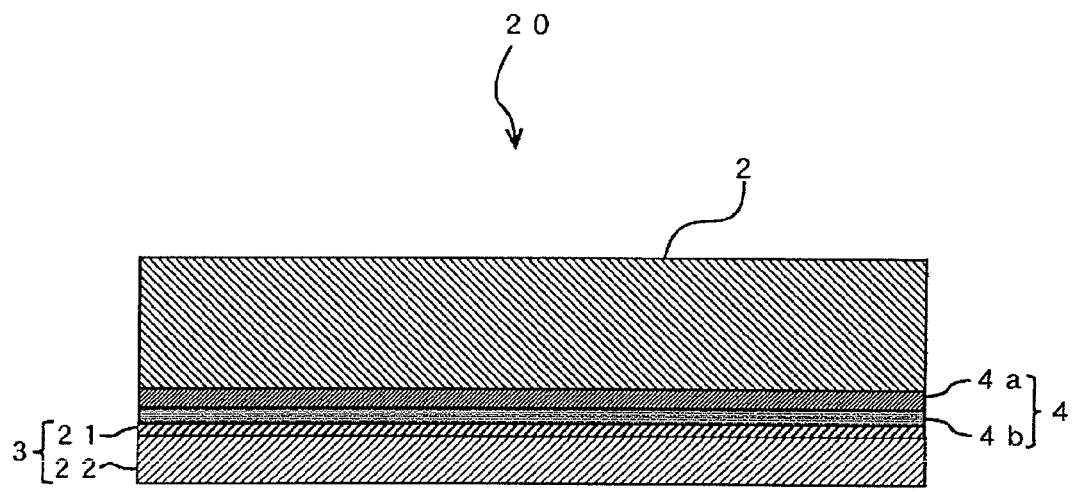
FIG. 3 is a schematic sectional view of a second copper foil with carrier sheet.
Figure 4:
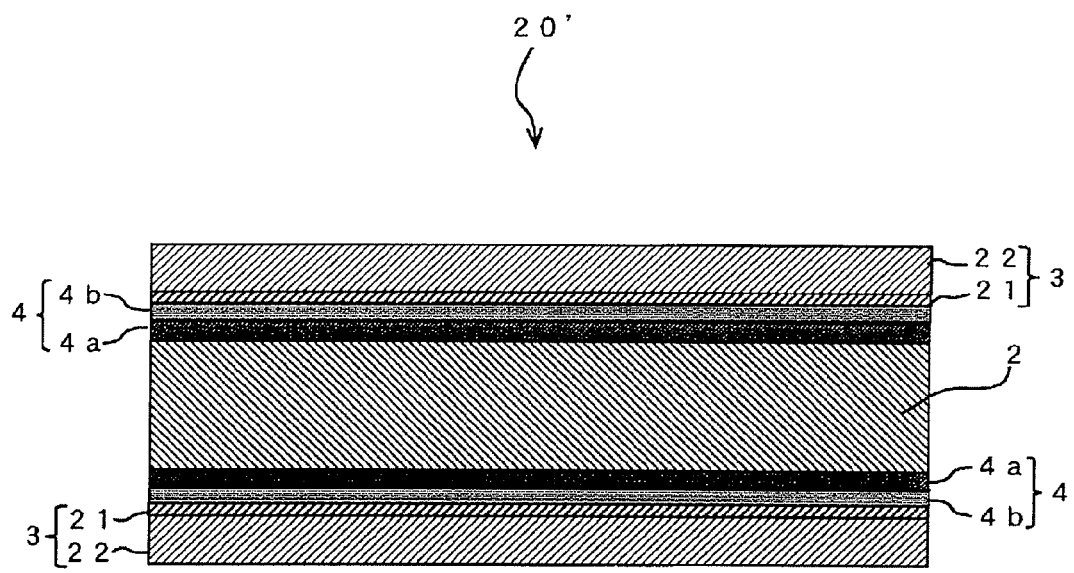
FIG. 4 is a schematic sectional view of a second double-side copper foil with carrier sheet.

The basic stacked structure of another copper foil with carrier sheet (a second copper foil with carrier sheet) according to the present invention is shown in FIG. 3. As is seen in the FIG. 3, a copper foil with carrier sheet 20 according to the present invention, the bonding interface layer 4 is provided between the carrier sheet 2 and the copper foil layer 3. And the bonding interface layer is composed of the metal layer 4a and the carbon layer 4b to enable the carrier sheet to be physically peeled off, as same as the first copper foil with carrier sheet. The bonding interface layer may either be formed on one surface or both surfaces of the carrier sheet. The copper foil layer to be referred to in the subsequent description is deposited on the bonding interface layer that is formed before. Therefore, the second copper foil with carrier sheet according to the present invention may have copper foil layers on both surfaces of the carrier sheet as shown in FIG. 4, as well as the copper foil with carrier sheet 20'. The difference from the first copper foil with carrier sheet is that the copper foil layer is composed of a first copper layer 21 formed by physical vapor deposition and a second copper foil layer 22 formed electrolytically. The presence of the first copper layer not only performs to ease the formation of the second copper foil layer by electrolysis but also serves to stabilize the release strength when the carrier sheet is to be released. Common constituents in the first copper foil with carrier sheet and the second copper foil with carrier sheet will be described below.

First, the carrier sheet will be described. The carrier sheet which looks to be laminated with the copper foil layer in plane, is required to have the following properties. When a conventional method for manufacturing a copper foil with carrier sheet is considered, such a foil is manufactured by electrodepositing metal copper on the surface of the carrier in a continuous process. So, electroconductivity is required on the surface of the carrier at least. However, in the copper foil with carrier sheet of the present application, the bonding interface layer is formed by physical vapor deposition. As the bonding interface layer is electroconductive, there is no particular need to require the carrier sheet to have electroconductivity. Therefore, in the copper foil with carrier sheet, the carrier sheet is required to have certain strength to perform supporting and protecting the copper foil layer in all aspects to maintain the state being bonded with the copper foil layer until finishing production of the copper-clad laminate at least and ease handling in the process until then. In the materials which satisfy such requirements, not only metal foils such as copper foil, nickel foil, stainless steel foil and aluminum foil, but also resin films such as PET film, aramid film, polyimide film and nylon film, and metal coated resin films such as a resin film having a coated metal layer on the resin film are acceptable.

However, in view of the recycle and the cost, it is preferable to use a copper foil for the carrier sheet. When a copper foil is used for the carrier sheet, the metal foil of 12 μm to 210 μm thick is preferably used. As is evident in the conventional technology, wet electrolysis is the most suitable method for forming a metal copper layer having a sufficient thickness for electroconductive wiring. When productivity is the matter to be considered, wet electrolysis is an established method which enables production in a high current density, so a large current capacity is required to the carrier sheet. However, when only the bonding interface layer is a conductor, its thickness cannot withstand production with a large current. Therefore, it is preferable to use a copper foil with thickness of at least 12 μm which has plenty of experience in treating with sufficient current required for formation of a copper foil layer electrolyzed on the surface of a carrier sheet. In contrast, the upper limit of thickness is 210 μm from the viewpoints of practical use and manufacturing cost. Further, the copper foil for a carrier sheet may be whichever of a rolled copper foil (which may be a copper alloy foil as well) manufactured by a rolling process and an electrodeposited copper foil manufactured by an electrodeposition process.

Next, the bonding interface layer formed on the carrier sheet will be described first. The bonding interface layer of the copper foil with carrier sheet according to the present invention applies multiple-layer structure, two-layer of metal layer/carbon layer for both the first copper foil with carrier sheet and the second copper foil with carrier sheet.

The metal layer constituting the bonding interface layer will be described. Just the metal layer is supposed to give a suitable adhesion and sufficient releasability at temperature as received when a metal which form passivation layer easily on the surface is selectively used for the material. However, when hot pressing at high temperature is loaded on a metallic carrier sheet, the carrier sheet itself will perform as a reducing agent for the passivation layer of the metal layer. As a result, counter diffusion through the interfaces of carrier sheet/bonding interface layer/copper foil layer may occur to form metal bond to worsen releasability. Therefore, carbon which hardly diffuses and reacts with the metallic carrier sheet is arranged in a suitable thickness to prevent formation of metal bond due to high temperature heating between the copper foil layer and the bonding interface layer even after hot pressing at a temperature exceeding 300° C. Then, a state in which the carrier sheet can be easily released is thereby maintained.

The metal layer is formed by applying a metal which can bond with carbon stably. So, tantalum, niobium, zirconium, nickel, chromium, titanium, iron, silicon, molybdenum, vanadium, tungsten and the like may be used. Preferable thickness by calculation of the metal layer is 1 nm to 50 nm. More preferable thickness by calculation is 4 nm to 50 nm. When the thickness of the metal layer is less than 1 nm, the thickness of the metal layer will be uneven to hardly perform a diffusion barrier. On the other hand, the thicker the metal layer, the easier the releasing of the copper foil layer from the bonding interface layer even after hot pressing at a temperature exceeding 300° C. But, even when the thickness of the metal layer is greater than 50 nm, the releasability will not be improved any more, and it may be a waste of resources.

Among the constituents of metal layer exemplified above, it is preferable to use titanium, tantalum or tungsten because of its stability as a diffusion barrier when subjected to high temperature pressing and the like. In particular, for titanium, it is well known that its passivation layer has excellent high temperature resistance because it is a very strong and hard oxide layer usually composed of a composite of rutile type oxide and anatase type oxide. However, such a titanium layer (coat) is hardly formed by electrolysis. Therefore, the titanium layer according to the present invention is formed by using physical vapor deposition, such as sputtering vapor deposition to be described later.

Then, the carbon layer is formed on the metal layer. The carbon layer, too, is the common bonding interface layer constituent of the first copper foil with carrier sheet and the second copper foil with carrier sheet. Further, the carbon layer is also formed by using physical vapor deposition, such as sputtering vapor deposition to be described later. Therefore, carbons in organics are not included. It is well known that the carbon has various structures, typical one is either of the diamond structure or the graphite structure, and both structure is acceptable. When the thickness of the carbon layer is less than 1 nm, the carbon layer is too thin to perform prevention of counter diffusion and results similar performance with when the bonding interface layer of a carrier sheet/bonding interface layer/copper foil layer is formed of just a metal layer. On the other hand, even when the thickness by calculation of the carbon layer exceeding 20 nm, the releasability will not be improved any more, and it would be a waste of resources.

It is preferable for the bonding interface layer to be 2 nm to 70 nm in the thickness by calculation as sum of the thickness of the metal layer and the carbon layer. When the thickness of the bonding interface layer is less than 2 nm, releasing of the carrier foil layer from the copper foil layer is made difficult after hot pressing at a temperature of exceeding 300° C. On the other hand, the upper limit of the bonding interface layer of 70 nm is set with the following reason. It is most preferable for the bonding interface layer to be electroconductive as a result it is composed of the metal layer and the carbon layer both electroconductive. However, even when an electroconductivity of the substance is rather small, conductivity can be achieved by a tunnel effect when it is a sufficiently thin film. Therefore, the sum of the thickness of the metal layer and the carbon layer should be considered. Even when metal carbide which exists on the interface between the metal layer and carbon layer raises the electric resistance, acceptable conductivity can be obtained when the thickness is no more than 70 nm. By the way, the thickness by calculation means a thickness calculated from the quantity chemically analyzed on the stuck component per unit area. Therefore, since the bonding interface layer is composed of two layers, the metal layer and the carbon layer in the copper foil with carrier sheet according to the present invention, the thickness by calculation is calculated for each of the metal layer and the carbon layer. Then, the thickness by calculation of the bonding interface layer is obtained as the sum of the two thicknesses by calculation.

It is preferable to form the copper foil layer on the carbon layer of the bonding interface layer by either electrolysis or physical vapor deposition. When electrolysis is conducted, the copper layer is formed by depositing copper on the carbon layer by using a sulfuric acid-based copper electrolyte, a copper pyrophosphate-based copper electrolyte and the like. The advantage in conducting electrolysis consists in that it allows the formation of a copper foil layer in the order of micrometers rapidly and inexpensive. On the other hand, when physical vapor deposition is used, it may cost more expensive than when electrolysis is applied. However, as the carbon layer can be protected from contact with the solution which occurs in electrolysis, the carbon layer does not absorb moisture, and it enables the bonding interface layer to maintain steady quality.

Further, it is preferable for the copper foil layer to be formed in a two-stage process. It is also preferable to use a copper layer obtained by forming the first copper layer in a thickness by calculation of 10 nm to 300 nm on the carbon layer by physical vapor deposition followed by forming of the second copper layer of any desired thickness by electrolysis. The first copper layer formed on the carbon in the bonding interface layer is formed by using physical vapor deposition, such as sputtering vapor deposition to be described later. It has to be noted about the first copper layer that, when a copper foil layer is formed by electrolysis directly on the carbon layer, the electric resistance for electric power supply increases by the influence of the carbon layer. As a result, there may be tendency that the copper foil layer is formed in lower speed and/or finished uneven. Therefore, electric power is supplied after forming a copper layer (the first copper layer) which is a good electroconductor on the carbon layer by physical vapor deposition, in forming of the second copper layer by electrolysis; the electric resistance is reduced to enable forming a copper foil layer with uniform thickness in high speed. Preferable thickness of the first copper layer is 10 nm to 300 nm. When the thickness by calculation of the first copper layer is less than 10 nm, even though physical vapor deposition is used, the carbon layer cannot be covered uniformly. In contrast, when the thickness by calculation of the first copper layer exceeds 300 nm, there will be no significant decrease in electric resistance when electric power is supplied to the first copper layer, so there will be no need to use physical vapor deposition which costs more expensive than electrolysis to achieve a greater thickness. It should be noted that electrolysis is used to form the second copper layer in consideration of manufacturing cost. And there is no limitation on the thickness of the second copper layer, it can be the thickness required for the intended use.

It is preferable for the carrier releasing strength as received of the copper foil with carrier sheet according to the present invention to be 2 gf/cm to 20 gf/cm. As described above, the copper foil with carrier sheet should maintain the state being bonded with the copper foil layer at least until finishing production of the copper-clad laminate, and it should be estimated that treatment at high temperature may worsen its releasability. Therefore, the lower limit of the carrier releasing strength 2 gf/cm is suitable because releasing hardly occur during the handling until finishing production of the copper-clad laminate. The upper limit 20 gf/cm is suitable because the releasing strength after heating can be maintained at a level acceptable in the practical use.

It is preferable for the carrier releasing strength after heating at 300° C. to 350° C. for 30 minutes of the copper foil with carrier sheet according to the present invention to be 5 gf/cm to 50 gf/cm. The acceptable range of the release strength of the carrier sheet after laminating with the insulating layer is said to be 20 gf/cm to 100 gf/cm. However, the thermal hysteresis subjected in the hot pressing process varies with the type of the constituent material of the insulating layer. For instance, when a fluorine-containing resin or a liquid crystal polymer is applied, the heating temperature will be far exceeding 300° C., but the time might be short, because it is a thermoplastic resin. On the other hand, when the polyimide resin, a thermosetting resin is used in casting method, the molten resin is coated in high temperature of about 400° C. but for a short period of time followed by curing at a relatively low temperature of around 200° C. So, preferable range for the carrier releasing strength after heating at 300° C. to 350° C. for 30 minutes is 5 gf/cm to 50 gf/cm for the purpose to enable suitable application in such various heating conditions.

Figure 5:
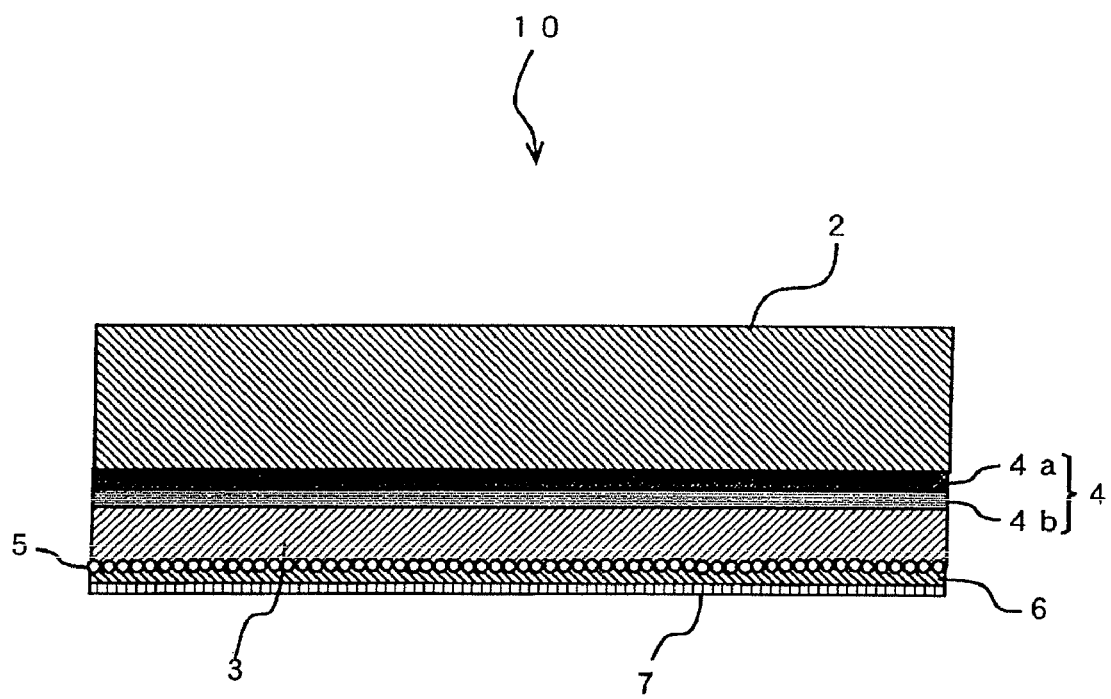
FIG. 5 is a schematic sectional view of a surface-treated first copper foil with carrier sheet.

Embodiment of the surface-treated copper foil with carrier sheet according to the present invention: A schematic sectional view of the surface-treated copper foil with carrier sheet according to the present invention is shown in FIG. 5 as the stacked structure of the first surface-treated copper foil with carrier sheet. The FIG. 5 shows the surface-treated copper foil with carrier sheet wherein fine copper particles 5 are formed to stick onto the surface of the copper foil layer of the copper foil with carrier sheet shown in FIG. 1 as roughening treatment, and a rust-proofing layer 6 and a silane coupling agent treating layer 7 are further formed on the roughening treatment. The surface-treated copper foil with carrier sheet can be manufactured by applying roughening treatment, rust-proofing treatment, silane coupling agent treatment and the like to the surface of the copper foil layer of the copper foil with carrier sheet according to the present invention through popular methods. For the usage of a printed wiring board, which is the main application, the surface state can be at least designed to be optimal for the insulating layer constituent material to be laminated. Therefore, it is preferable to design the optimal layer structure, for example, when the insulating layer constituent material performs a chemical bonding greatly, just rust-proofing treatment with silane coupling agent treatment in which the chemical bonding is a main issue is applied. In contrast, when the insulating layer constituent material performs a weak chemical bonding, to perform a physical anchor effect, roughening treatment, rust-proofing treatment and silane coupling agent treatment are applied. Also about the rust-proofing treatment described above, either rust-proofing treatment by a wet process or rust-proofing treatment by physical vapor deposition may be applied.

Embodiment of manufacturing the copper foil with carrier sheet according to the present invention: Manufacturing process of the copper foil with carrier sheet according to the present invention is different between the first copper foil with carrier sheet and the second copper foil with carrier sheet. Manufacturing methods will be described one by one below.

The method for manufacturing the first copper foil with carrier sheet is characterized in that it comprises process A and process B described below. However, it is preferable to clean the surface of the carrier sheet before the formation of the bonding interface layer. For the cleaning of the carrier sheet, it is preferable to apply one or two processes selected from degreasing, acid pickling, soft etching and/or dry etching. As described above, when a rolled copper foil is used for the carrier sheet, cleaning is greatly required in particular. A rolled copper foil is produced in such a manner, making a copper metal thinner and thinner by applying pressure while passing through two rotating rollers. In the process, rolling oil is supplied to the gap of rollers for cooling. Therefore, the rolling oil and a slight oxidized film remain on the surface of the finished rolled copper foil. In the case of an electrodeposited copper foil, sulfuric acid and copper sulfate may stick a little because the copper electrolyte used for electrolysis is the sulfuric acid base solution. So, the surface is easy to be oxidized, and a sulfate and/or an oxide film may be remaining on the surface of an electrodeposited copper foil.

When the bonding interface layer is formed without cleaning of the carrier sheet followed by the copper foil layer formation, not only the deviation of the bonding strength of the carrier sheet to the bonding interface layer tends to be big, but also the deviation of the thickness and the surface roughness tends to be big. Therefore, it is preferable to apply a cleaning which method is selected according to the characteristics of the substances existing on the carrier surface. When there remains some oil for instance, alkali degreasing and/or electrolytic degreasing is performed followed by acid pickling or soft etching. It is also preferable to perform cleaning by pre-sputtering with argon ions and the like in a vacuum chamber. Further, when a metal foil is used for the carrier sheet, it is also preferable to prevent oxidation before by treating the surface for rust-proofing. For an electrodeposited copper foil and the like, whose production process is oil free, the cleaning can be eliminated.

Then, process A will be described. The process A is a bonding interface layer forming process to form the bonding interface layer comprising the metal layer and the carbon layer on the surface of the carrier sheet by using thin film forming technologies. As the thin film forming technologies here, it is preferable to use film forming technologies of dry process. Thus, it is preferable to use any one of vacuum deposition, sputtering vapor deposition and chemical vapor deposition. However, sputtering vapor deposition is the most suitable for the formation of the metal layer and the carbon layer used in the present invention. In addition, when a lot of targets are arranged under the conditions of step i and step ii described below, forming of metal layers and carbon layers on the surface of a carrier sheet unwound from a carrier sheet roll having a width of over 1 m can be made possible.

In step i, metal layer is formed by depositing metal atoms on the surface of the carrier sheet by sputtering vapor deposition. Target material used in the step i is the one selected from tantalum, niobium, zirconium, nickel, chromium, titanium, iron, silicon, molybdenum, vanadium and tungsten. In step ii, the carbon layer is formed on the metal layer by sputtering vapor deposition using a carbon target material to finish a composite layer. There are no particular limitation on the sputtering medium used either at step i or step ii, but it is popular to use argon ions or nitrogen ions. The sputtering medium, which may be argon ions or nitrogen ions, is obtained by electrolytically ionizing argon gas or nitrogen gas into a plasma state. Then sputtering medium is shot to the target by an applied accelerating voltage to sputter out metal atoms or carbon atoms which are the constituents of the targets. The sputtering medium is selected as appropriate according to the type of the target. For instance, when argon ion and nitrogen ion are compared as a sputtering medium, argon ion generally has an advantage in a higher sputter rate to result higher level of productivity than nitrogen ion. However, argon ion has a disadvantage to make the target life short because the surface of the target material tends to be rough. In contrast, nitrogen ion as a sputtering medium has tendency to show lower sputter rate and poor productivity when compared to argon ion, but it may perform longer life of the target material with resulting less roughened target material surface. Thus, sputtering mediums has their own characteristic features. Therefore, the selection of the sputtering medium can be appropriately determined in consideration of the character of the production line and the required level of productivity.

And it is preferable for the sputtering vapor deposition at step i and step ii to use a magnetron sputtering method in view of its higher film formation speed and suitable for continuous industrial production. In practice, a certain voltage is applied to the target to generate a magnetic field parallel to the target surface, glow discharge generate ions as the sputtering medium, and ions are shot to the target surface. Then, secondary electrons come out from the target surface are caught by the Lorentz force to be into a cyclotron motion. As a result, promotion of both ionization of the sputtering medium gas and deposition of the target atoms on the surface of the carrier sheet on which layer is to be formed are performed.

When a target of 6 inches×12 inches is used, it is preferred to apply electric power of 1 kW to 5 kW (hereinafter referred to as simply "sputtering power") to the target. When the sputtering power excess 5 kW, it may be difficult to guide the metal atoms or the carbon atoms sputtered out from the target material onto the carrier sheet surface, and the material loss deposit on the side walls of the sputtering chamber and elsewhere will increase. So, it is not preferable. On the other hand, when the sputtering power is less than 1 kW, productivity level required in the industry may not be achieved, and deviation of the thicknesses in the metal layer and/or the carbon layer formed may increase.

Next, process B will be described. Process B is a copper foil layer forming process to form the copper foil layer by electrolysis or physical vapor deposition on the composite layer comprising the metal layer and the carbon layer. When the copper foil layer is to be formed by electrolysis, wet electrolysis methods which use a sulfuric acid-based copper electrolyte or a copper pyrophosphate-based copper electrolyte and the like can be used. In the process B, the carrier sheet with bonding interface layer is made to contact with the copper electrolyte and polarized as cathode to electrodeposit copper on the bonding interface layer. There is no particular limitation for the copper electrolyte used in the process B.

In addition, when the copper foil layer is formed by physical vapor deposition on the composite layer of the metal layer and the carbon layer, it is performed by using the sputtering vapor deposition and the like.

Further, it should be noted that, when the surface-treated copper foil with carrier sheet according to the present invention is manufactured, process A and process B described above may be followed by a roughening treatment step, a rust-proofing treatment step, a silane coupling agent treatment step, a rinsing step, a drying step and the like.

Next, the method for manufacturing the second copper foil with carrier sheet will be described. The method for manufacturing the second copper foil with carrier sheet includes process a to process c to be described below. Process a and process A in the method for manufacturing the first copper foil with carrier sheet are common. Therefore, to avoid duplicated description, description of process a in the method for manufacturing the second copper foil with carrier sheet will be omitted.

So, process b will be described. The process b is a first copper layer forming process to form the first copper layer on the surface of the carbon layer. Thus, the concept of the formation of the first copper layer is same with that of process A described above. It is also preferable to apply sputtering vapor deposition as a physical vapor deposition technology and use the magnetron sputtering method in view of higher film formation speed and suitable for continuous industrial production. The selection of the sputtering conditions in using the sputtering vapor deposition may be appropriately determined in consideration of the characteristics of the production line and the productivity required.

Then, process c is a copper foil layer forming process to finish the copper foil layer by forming the second copper foil layer by electrolysis on the first copper layer. The electrolytic conditions can be the same as in process B in the method for manufacturing the first copper foil with carrier sheet described above.

Embodiment of the copper-clad laminate according to the present invention: A copper-clad laminate of high quality can be manufactured by using the surface-treated copper foil with carrier sheet according to the present invention. The copper-clad laminate obtained by using the copper foil with carrier sheet according to the present invention is a copper-clad laminate which is free from the surface contamination on the copper foil layer. Because, generation of the wrinkle is prevented through handling to the laminating process, and the copper foil layer is protected by the carrier sheet. Thus, it is made possible to provide a copper-clad laminate which is useful for manufacturing a fine pitch printed wiring boards, comprising an ultra-thin electrodeposited copper foil with less surface contamination and defects such as wrinkle and/or adhesion of foreign materials. Moreover, the carrier sheet can be easily removed even after hot pressing at a high temperature exceeding 300° C.

Examples in which copper foil with carrier sheet products according to the present invention were manufactured will be described. In the examples, a number of copper-clad laminates were prepared with various hot pressing temperatures by using the products obtained. In addition, the results of investigations on the release strengths of the carrier layers and the copper foil layers will be described.

EXAMPLE 1

In the example 1, the first copper foil with carrier sheet 1 shown in FIG. 1 was manufactured. For the carrier sheet 2A, an electrodeposited copper foil of 35 µm thick classified to grade 3 was used, and the 3 µm thick copper foil layer 3 was formed on the shiny side where average roughness (Ra) is 0.21 µm. The production conditions will be described in step by step of processing. In the electrolysis steps described below, a dimensionally stable anode (DSA) was commonly used for the anode unless the material is otherwise stated specifically.

First, acid pickling was performed to the carrier sheet 2. In the acid pickling, the carrier sheet 2 was dipped for 30 seconds in a diluted sulfuric acid solution of 150 g/l in sulfuric acid concentration and 30° C. in solution temperature to remove the oxide film on the surface, followed by rinsing with water and then drying.

Process A: The sputtering apparatus used for the formation of the bonding interface layer on the carrier sheet after dried was a wind-up type sputtering apparatus SPW-155 manufactured by Nihon Shinkugijutsu Co., and the target used was a titanium target of 300 mm×1700 mm in size. As for sputtering conditions, an achieved vacuum level Pu was less than $1\times10^{-4}$ Pa, a sputtering pressure PAr was 0.1 Pa and a sputtering power was 30 kW. Then, a titanium layer of 10 nm thick was formed on the carrier sheet, i.e. shiny side of the electrodeposited copper foil.

Then, a wind-up type apparatus SPW-155 manufactured by Nihon Shinkugijutsu Co. was used for the sputtering apparatus, and the target used was a carbon target of 300 mm×1700 mm in size. As for sputtering conditions, an achieved vacuum level Pu was less than $1\times10^{-4}$ Pa, a sputtering pressure PAr was 0.4 Pa and a sputtering power was 20 kW. Then, a carbon layer of 1 nm thick was formed on the titanium layer.

Process B: After finishing formation of the bonding interface layer as described above, the copper foil layer was formed on the bonding interface layer. A copper sulfate solution in which sulfuric acid concentration is 150 g/l, copper concentration is 65 g/l and solution temperature is 45° C. was used in the formation of the copper foil layer in the example 1. In a cell filled with the solution, a flat anode was arranged in parallel to the surface on which the bonding interface layer was formed. Then, the carrier sheet 2 was polarized as cathode, and electrolysis was conducted for 40 seconds under a level plating condition of 24 A/dm$^2$ in current density to form a copper foil layer of 3 µm thick to obtain the copper foil with carrier sheet.

After finishing the formation of the copper foil layer, a fine copper particle formation step was carried out to form and stick fine copper particles on the surface of the copper foil layer. In the fine copper particle formation step, a copper sulfate solution of similar kind which has been used in the formation of the copper foil layer in which sulfuric acid concentration is 100 g/l, copper concentration is 18 g/l and solution temperature is 25° C. was used. And in a cell filled with the solution, a flat anode was arranged in parallel to the surface on which the copper foil layer was formed. Then, the carrier was polarized as cathode, and electrolysis was conducted for 10 seconds under a burning plating condition of 10 A/dm$^2$ in current density to form and stick fine copper particles.

Next, a seal plating step was carried out to prevent the fine copper particles from dropping off. In the seal plating step, electrolysis was conducted for 20 seconds under a level plating condition by using exactly the same copper sulfate solution and method as what were used in the formation of the copper foil layer described above.

Further, rust-proofing treatment step followed by silane coupling agent treatment step was carried out. In the rust-proofing treatment step in the example 1, zinc is used for the rust-proofing element, and rust-proofing was performed not only on the surface of the copper foil layer but also on the surface of the carrier layer. Therefore, zinc plates, which are soluble anodes, are used for the anodes by arranging on both sides of roughening treated copper foil with carrier sheet to maintain the zinc concentration balance in the rust-proofing cell. In practice, a zinc sulfate bath was used for the electrolyte which maintained the sulfuric acid concentration of 70 g/l and the zinc concentration of 20 g/l respectively and at a solution temperature of 40° C. Then, electrolysis was conducted for 15 seconds in current density of 15 A/dm². After finishing the rust-proofing treatment, the product was rinsed with water.

In addition, with a view to strengthen the rust-proofing effect, electrolytic chromate rust-proofing treatment was applied on the zinc rust-proofing layer. A chromate layer was formed on the zinc rust-proofing layer by electrolysis. The electrolytic condition was electrolysis for 5 seconds with current density of 8 A/dm² in 5.0 g/l in chromic acid concentration, 11.5 in pH, and 35° C. in solution temperature. The electrolytic chromate rust-proofing was applied not only to the copper foil layer surface rust-proofed with zinc but also to the carrier layer surface with rust-proofing layer of zinc.

After finishing the rust-proofing treatment, the silane coupling agent was adsorbed just onto the rust-proofing layer of the roughened surface of the copper foil layer in the silane coupling agent treatment cell immediately after rinsing with water following the rust-proofing treatment. The solution was prepared by adding γ-glycidoxypropyltrimethoxysilane to a de-ionized water as the solvent to be a composition, concentration of 5 g/l. The adsorption was performed by spraying the solution on the surface.

After finishing the silane coupling agent treatment, the foil was passed through the heated furnace, in which the ambient temperature is controlled by an electric heater to make the foil temperature to 140° C., in 4 seconds to remove the moisture and accelerate the condensation reaction of the silane coupling agent. As such, finished surface-treated copper foil with carrier sheet was obtained.

The thickness of the titanium layer in the bonding interface layer of the obtained surface-treated copper foil with carrier sheet was 10 nm in average, and the thickness of the carbon layer was 1 nm in average. For the surface-treated copper foil with carrier sheet before heating, an adhesive was applied to the copper foil layer side to fix it to a cured FR-4 base material of 150 μm thick. Then the carrier sheet was released to examine the release strength of the carrier sheet on the copper foil layer at 10 points. As a result, the release strength as received measured was 3.1 gf/cm in average. In addition, another surface-treated copper foil with carrier sheet was heated in an oven at 330° C. for 30 minutes. After heating, the copper foil layer side of the surface-treated copper foil with carrier sheet after heating was fixed to an FR-4 base material in the same manner as the foregoing, and then the release strength of carrier sheet on the copper foil layer was measured at 10 points. As a result, the release strength measured was 20.2 gf/cm in average.

EXAMPLE 2

In the example 2, the result in manufacturing of the second copper foil with carrier sheet 20 shown in FIG. 3 will be described. In the example 2, the same electrodeposited copper foil as in Example 1 was used for the carrier sheet 2, and the copper foil layer 3 of 3 μm thick was formed on the shiny side where average roughness (Ra) is 0.21 μm. The manufacturing conditions will be described below in step by step of processing. In the example 2, acid pickling was performed to the carrier sheet 2 under the same conditions as in Example 1 first.

Process a: To prepare samples 1 to 4 listed in Table 1, titanium layers as metal layer having various thicknesses were formed on the carrier sheets, i.e. the shiny side of the electrodeposited copper foils, by the same method as process A of Example 1.

Then, to prepare samples 1 to 4 listed in Table 1, carbon layers of various thicknesses were formed on the titanium layers of the samples by the same method as process A of Example 1.

Process b: Next, the first copper layer was formed on the carbon layer. A wind-up type sputtering apparatus SPW-155 manufactured by Nihon Shinkugijutsu Co. was used for the sputtering apparatus, and the target used was a copper target of 300 mm×1700 mm in size. The sputtering conditions were as follows. To prepare samples 1 to 4 listed in Table 1, the achieved vacuum level Pu was set to below 1×10⁻⁴ Pa and the sputtering pressure PAr was 0.4 Pa and the sputtering power was varied as appropriate. Then, the samples with first copper layers formed in various thicknesses were prepared.

Process c: After finishing the first copper layer, the second copper layer was formed on the surface of the first copper layer. The condition to form the second copper layer in the example 2 was the same as for Example 1 to make sum of the thickness of the first copper layer and the second copper layer 3 μm.

In addition as in Example 1, the fine copper particle formation step was carried out to form and stick fine copper particles to the surface of the copper foil layer, and a seal plating step was carried out to prevent the fine copper particles from dropping off. Further, rust-proofing treatment step using zinc and chromate followed by silane coupling agent treatment step were performed.

The results of measuring the release strength as received, the release strength after 30 minute heating in an oven at 230° C. and the release strength after 30 minute heating in an oven at 350° C. of the second surface-treated copper foils with carrier sheet obtained are shown in Table 1 together.

TABLE 1

| | Structure of copper foil with carrier sheet | | | Release strength (gf/cm) | | |
| --- | --- | --- | --- | --- | --- | --- |
| | Bonding interface layer (nm) | | Copper foil layer (nm) | | After | After |
| Sample | Titanium layer | Carbon layer | First copper layer* | As received | heating at 230° C. | heating at 350° C. |
| Sample 1 | 25 | 7.0 | 32 | 15.8 | 12.6 | 20.3 |
| Sample 2 | 16 | 2.6 | 16 | 15.0 | 11.6 | 32.7 |
| Sample 3 | 4 | 1.0 | 80 | 6.0 | 14.3 | 44.2 |
| Sample 4 | 45 | 20.0 | 50 | 7.7 | 5.9 | 6.9 |

*The thickness of the copper foil layer is about 3 μm in sum of the first copper layer and the second copper layer.

EXAMPLE 3

In the example 3, the second copper foil with carrier sheet 20 shown in FIG. 3 was manufactured in a similar process to that in Example 2. Since the process is basically the same as that in Example 2, only the different parts will be described.

First, acid pickling was performed to the carrier sheet 2. In the acid pickling, the carrier sheet 2 was dipped for 30 seconds in a diluted sulfuric acid solution of 150 g/l in sulfuric acid concentration and 30° C. in solution temperature to remove the oxide film on the surface, followed by rinsing with water and then drying.

Process a: For the formation of the bonding interface layer on the carrier sheet dried, a wind-up type sputtering apparatus SPW-155 manufactured by Nihon Shinkugijutsu Co. was used for the sputtering apparatus, and the target used was a nickel target of 300 mm×1700 mm in size. As for sputtering conditions, an achieved vacuum level Pu was less than $1\times10^{-4}$ Pa, a sputtering pressure PAr was 0.1 Pa and a sputtering power was 13 kW. Then, a nickel layer of 34 nm thick was formed on the carrier sheet, i.e. the shiny side of the electrodeposited copper foil.

Then, by the same method as process A of Example 1, a carbon layer of 1 nm thick was formed on the nickel layer of each sample.

Process b: Next, the first copper layer was formed on the carbon layer. As for conditions of forming the first copper layer, an achieved vacuum level Pu was less than $1\times10^{-4}$ Pa, a sputtering pressure PAr was 0.1 Pa and a sputtering power was 10 kW. Then, the first copper layer of 32 nm thick was formed for each sample.

Process c: After finishing the formation of the first copper layer as described above, the second copper layer was formed on the surface of the first copper layer. The condition to form the second copper layer in the example 3 was the same as for Example 2 to make sum of the thickness of the first copper layer and the second copper layer 3 μm.

The release strength as received measured in the same manner as in Example 1 on the surface-treated copper foil with carrier sheet obtained was 3.4 gf/cm in average. The release strength of the surface-treated copper foil with carrier sheet measured after heating in oven at 230° C. and 350° C. for 30 minutes were 3.5 gf/cm and 31.8 gf/cm in average respectively.

EXAMPLE 4

The example 4 differs from Example 1 only in that the formation of the copper foil layer in process B was performed by physical vapor deposition and the part of the rust-proofing treatment was performed by physical vapor deposition. Therefore, just these differences will be described, followed by the examination results.

In process B, after finishing the formation of the bonding interface layer in process A, the copper foil layer was formed on its surface by using electron beam vapor deposition. The thickness of the copper foil layer in the example 4 was set to 3 μm. As for the conditions of film formation by electron beam vapor deposition, an achieved vacuum level Pu was not more than $1\times10^{-2}$ Pa and a processing speed was 2 m/min with the carrier foil temperature of room temperature.

Then, the rust-proofing layer was formed on the surface of the copper foil layer. The rust-proofing layer was formed as a zinc layer. A magnetron type sputtering apparatus similar to the foregoing was used for the sputtering apparatus, and the target used was a zinc target of 300 mm×1700 mm in size. As for the sputtering conditions, an achieved vacuum level Pu was less than $1\times10^{-3}$ Pa, a sputtering pressure PAr was 0.4 Pa and a sputtering power was 6 kW. Then, a zinc layer of 5 nm thick was formed on the copper layer.

Further, after finishing the formation of the rust-proofing layer, the silane coupling agent was immediately adsorbed just onto the rust-proofing layer of the copper foil layer in the silane coupling agent treatment cell. The solution was prepared by adding γ-glycidoxypropyltrimethoxysilane to a deionized water as the solvent to be a composition, concentration of 5 g/l. The adsorption was performed by spraying the solution on the surface.

After finishing the silane coupling agent treatment, the foil was passed through the heated furnace, in which the ambient temperature is controlled by an electric heater to make the foil temperature to 140° C., in 4 seconds to remove the moisture and accelerate the condensation reaction of the silane coupling agent, to obtain finished surface-treated copper foil with carrier sheet.

The thickness of the titanium layer in the bonding interface layer of the surface-treated copper foil with carrier sheet obtained was 10 nm in average, and the thickness of the carbon layer was 1 nm in average. The release strength as received measured in the same manner as in Example 1 was 7.2 gf/cm in average. The release strength of the surface-treated copper foil with carrier sheet measured after heating in oven at 230° C. and 350° C. for 30 minutes were 5.8 gf/cm and 16.8 gf/cm in average respectively.

As is understood from the foregoing description of Examples 1 to 4, the carrier sheet of the surface-treated copper foil with carrier sheet according to the present invention can be easily peeled off with a force of 50 gf/cm or less even after heating at 300° C. to 350° C. for about 30 minutes.

COMPARATIVE EXAMPLES

Comparative Example 1

Manufacturing method in the comparative example 1 was similar to that of Example 1, except that the formation of the carbon layer was eliminated in the bonding interface layer forming in process A to obtain bonding interface layer, just a titanium layer of 8 nm thick. Then, a copper foil with carrier foil for comparison was manufactured, and further a surface-treated copper foil with carrier foil for comparison was obtained.

Release strengths in different states of the surface-treated copper foil with carrier foil for comparison obtained were measured in the same manner as for Example 1. As a result, the release strength as received was 4.5 gf/cm in average and after heating in an oven at 230° C. for 30 minutes was 28.6 gf/cm in average. However, after heating the surface-treated copper foil with carrier foil in an oven at 330° C. for 30 minutes, it was impossible to release the carrier foil.

Comparative Example 2

Production method in comparative example 2 was similar to that of Example 1, except that the formation of the titanium layer was eliminated in the bonding interface layer forming in process A to obtain bonding interface layer, just a carbon layer of 2 nm thick. Then, a copper foil with carrier foil for comparison was manufactured, and further a surface-treated copper foil with carrier foil for comparison was obtained.

Release strengths in different states of the surface-treated copper foil with carrier foil for comparison obtained were measured in the same manner as for Example 1. As a result, the release strength as received was 15.3 gf/cm in average. However, after heating the surface-treated copper foil with carrier foil in an oven at 230° C. or 330° C. for 30 minutes, it was impossible to release the carrier foil.

<Comparison Among Examples and Comparative Examples>

Comparison among Examples 1 to 4 and the comparative examples makes it evident that in the surface-treated copper foils with carrier foil of the Examples, the carrier foils can be easily released whether as received or after heating in an oven at a temperature of exceeding 300° C. for 30 minutes. Thus, in order to achieve such a performance featured, a bonding interface layer composed of the metal layer and the carbon layer according to the present invention is necessary for the surface-treated copper foil with carrier foil (or the copper foil with carrier foil).

INDUSTRIAL APPLICATION

By using the copper foil with carrier sheet or the surface-treated copper foil with carrier sheet according to the present invention, it is made possible to release the carrier layer from the copper foil layer even after subjecting to the high temperature in the production of a fluorine-containing resin based copper-clad laminate or a liquid crystal polymer copper-clad laminate which require hot pressing at a temperature of 300° C., or the production of a polyimide resin copper-clad laminate by casting methods or hot pressing. Moreover, it has been made possible to significantly reduce deviation of the release strength. As a result, an ultra-thin copper foil layer, which has been hardly applicable to a fluorine-containing resin substrate, a liquid crystal polymer, polyimide substrate and the like is made possible to be applicable by using the copper foil with carrier sheet according to the present invention. Thus, the product quality can be significantly improved and the formation of fine pitch wiring is made easy.

The invention claimed is:

1. A copper foil with a carrier sheet of which the carrier sheet is physically releasable, comprising a copper foil layer on the surface of the carrier sheet through a bonding interface layer, wherein the bonding interface layer has two layer structure composed of a metal layer formed on the carrier sheet by using physical vapor deposition and a carbon layer formed on the metal layer by using physical vapor deposition.

2. The copper foil with carrier sheet according to claim 1 wherein thickness of the carbon layer constituting said bonding interface layer is 1 nm to 20 nm.

3. The copper foil with carrier sheet according to claim 1 wherein the metal layer constituting said bonding interface layer is a layer composed of any of tantalum, niobium, zirconium, nickel, chromium, titanium, iron, silicon, molybdenum, vanadium and tungsten.

4. The copper foil with carrier sheet according to claim 1 wherein thickness of said metal layer is 1 nm to 50 nm.

5. The copper foil with carrier sheet according to claim 1 wherein thickness of said bonding interface layer is 2 nm to 70 nm.

6. The copper foil with carrier sheet according to claim 1 wherein said copper foil layer is a copper layer formed by electrolysis.

7. The copper foil with carrier sheet according to claim 1 wherein said copper foil layer is a copper layer formed by physical vapor deposition.

8. The copper foil with carrier sheet according to claim 1 wherein said copper foil layer is a copper layer obtained by forming a first copper layer of 10 nm to 300 nm thick by physical vapor deposition and forming a second copper layer by electrolysis.

9. The copper foil with carrier sheet according to claim 1 wherein the release strength of the carrier sheet as received is 2 gf/cm to 20 gf/cm.

10. The copper foil with carrier sheet according to claim 1 wherein the release strength of the carrier sheet after heating 30 minutes at 300° C. to 350° C. is 5 gf/cm to 50 gf/cm.

11. The copper foil with carrier sheet according to claim 1 wherein a metal foil of 12 μm to 210 μm thick is used for said carrier sheet.

12. A surface-treated copper foil with carrier sheet, which is obtained by subjecting one, two or more selected from roughening treatment, rust-proofing treatment and silane coupling agent treatment to a second surface of the copper foil layer of the copper foil with carrier sheet according claim 1 that is opposite to a first surface of the copper foil layer of the copper foil with carrier sheet having the bonding interface layer.

13. A method for manufacturing the copper foil with carrier sheet according to claim 1, wherein the manufacturing method comprises process A and process B described below: Process A: a bonding interface layer forming process to form a bonding interface layer in which a metal layer and a carbon layer are stacked on the surface of the carrier sheet by using physical vapor deposition thin film forming technologies; and Process B: a copper foil layer forming process to form a copper foil layer by electrolysis or physical vapor deposition on said bonding interface layer composed of the metal layer and the carbon layer.

14. The method for manufacturing the copper foil with carrier sheet according to claim 13, wherein the physical vapor deposition thin film forming technologies of said process A is sputtering vapor deposition.

15. The method for manufacturing the copper foil with carrier sheet according to claim 14, wherein the sputtering vapor deposition of said process A comprises step i and step ii described below: Step i: a step to form the metal layer by depositing metal atoms on the surface of the carrier sheet by sputtering vapor deposition using one target material selected from tantalum, niobium, zirconium, nickel, chromium, titanium, iron, silicon, molybdenum, vanadium and tungsten; and Step ii: a step to finish a bonding interface layer by forming a carbon layer on said metal layer by sputtering vapor deposition using a carbon target material.

16. A method for manufacturing the copper foil with carrier sheet according to claim 1, wherein the manufacturing method comprises processes a to c described below: Process a: a bonding interface layer forming process to form a bonding interface layer in which a metal layer and a carbon layer are stacked on the surface of the carrier sheet by using physical vapor deposition thin film forming technologies; Process b: a first copper layer forming process to form a first copper layer on the surface of said carbon layer by using physical vapor deposition; and Process c: a copper foil layer forming process to form a second copper layer by electrolysis on said first copper layer to finish the copper foil layer.

17. The method for manufacturing the copper foil with carrier sheet according to claim 16, wherein the physical vapor deposition thin film forming technologies of said process a is sputtering vapor deposition.

18. The method for manufacturing the copper foil with carrier sheet according to claim 17, wherein sputtering vapor deposition of said process a comprises step i and step ii described below: Step i: a step to form the metal layer by depositing metal atoms on the surface of the carrier sheet by sputtering vapor deposition using one target material selected from tantalum, niobium, zirconium, nickel, chromium, titanium, iron, silicon, molybdenum, vanadium and tungsten; and Step ii: a step to finish a bonding interface layer by forming a carbon layer on said metal layer by sputtering vapor deposition using a carbon target material.

* * * * *